(12) United States Patent
Ellsworth

(10) Patent No.: US 9,671,213 B2
(45) Date of Patent: *Jun. 6, 2017

(54) WEARABLE INPUT DEVICE

(71) Applicant: VALVE CORPORATION, Bellevue, WA (US)

(72) Inventor: Jeri Janet Ellsworth, Kirkland, WA (US)

(73) Assignee: Valve Corporation, Bellevue, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/664,847

(22) Filed: Mar. 21, 2015

(65) Prior Publication Data
US 2015/0192402 A1 Jul. 9, 2015

Related U.S. Application Data

(63) Continuation of application No. 13/831,128, filed on Mar. 14, 2013, now Pat. No. 8,986,125.

(51) Int. Cl.
| | |
|---|---|
| *A63F 13/00* | (2014.01) |
| *G01B 7/14* | (2006.01) |
| *A63F 13/24* | (2014.01) |
| *A63F 13/212* | (2014.01) |
| *G01R 33/02* | (2006.01) |

(52) U.S. Cl.
CPC ............ *G01B 7/14* (2013.01); *A63F 13/00* (2013.01); *A63F 13/212* (2014.09); *A63F 13/24* (2014.09); *G01R 33/02* (2013.01); *G01B 2210/58* (2013.01)

(58) Field of Classification Search
CPC ...... A63F 13/00; A63F 13/02; A63F 2300/10; A63F 2300/1043
USPC .............. 463/1, 36, 37, 39, 47; 324/207.16
See application file for complete search history.

(56) References Cited

U.S. PATENT DOCUMENTS

| | | | |
|---|---|---|---|
| 6,184,755 | B1 | 2/2001 | Barber et al. |
| 6,211,799 | B1 | 4/2001 | Post et al. |
| 2004/0204240 | A1 | 10/2004 | Barney |
| 2005/0012037 | A1 | 1/2005 | McCracken |
| 2008/0150658 | A1 | 6/2008 | Vos |
| 2010/0134291 | A1 | 6/2010 | Lavedas |
| 2011/0022196 | A1 | 1/2011 | Linsky et al. |
| 2011/0300941 | A1 | 12/2011 | Weston et al. |

(Continued)

OTHER PUBLICATIONS

PCT International Search Report dated Jul. 8, 2014 of International Application No. PCT/US14/22192. 12 Pages.

*Primary Examiner* — Michael Cuff
(74) *Attorney, Agent, or Firm* — Barcelo, Harrison & Walker, LLP

(57) ABSTRACT

Methods and systems are disclosed for integrating LC circuits into a user's jewelry for controlling systems such as computer games. The resonant frequency of the circuit at each of multiple rings worn by the user may be adjustable. A secondary coil within each ring may be moved in relation to the magnetic field generated by a primary coil that may be part of another piece of jewelry, such as a watch or a bracelet, to generate control signals. The magnetic field may inductively couple and power the rings, which may each contain an LC tank circuit. If powered, each of these circuits may oscillate at its resonant frequency. A receiver system may comprise an antenna and a tuning circuit to detect a resonant frequency as an input to control moves of a character within a game, for example for use with heads-up displays (HUDs) for augmented reality applications.

19 Claims, 13 Drawing Sheets

(56) References Cited

U.S. PATENT DOCUMENTS

2013/0023954 A1  1/2013  Meskens
2013/0055879 A1  3/2013  Clark et al.
2013/0293025 A1  11/2013 Xu et al.
2013/0324041 A1  12/2013 Pagani
2014/0104288 A1  4/2014  Shenoy et al.

WEARABLE INPUT DEVICE

CROSS-REFERENCE TO RELATED APPLICATIONS

This application is a continuation of U.S. patent application Ser. No. 13/831,128 entitled "Wearable Input Device" and filed Mar. 14, 2013 and published as U.S. Patent Application Publication Number 2014-0274395 A1. The entirety of each of the foregoing patent applications and patent application publications is incorporated by reference herein.

BACKGROUND OF THE DISCLOSURE

1. Field of the Disclosure

The disclosure relates generally to the field of wearable computing systems and subsystems, such as methods and systems involving an item of jewelry such as a watch or a bracelet worn on a wrist of a user that may contain a coil for generating a magnetic field to inductively power a second piece of jewelry such as a ring that may contain an LC ("tank") circuit that may oscillate at a resonant frequency.

2. General Background

An inductor (L) and a capacitor (C) may be used together in a circuit typically referred to as a LC circuit, an LC tank circuit, an LC tuned circuit, or a resonant circuit to tune to specific frequencies. As is commonly known, an LC tank circuit may oscillate at a resonant frequency, and be used to isolate a signal at a particular frequency from a more complex signal. For example, a radio receiver typically has an antenna connected to a variable LC tank circuit, to tune to a desired LC resonant frequency among the signals coming in from the antenna, such as a specific radio station. If an LC tank circuit is connected to a power source, it may oscillate at a resonant frequency. The oscillation may be due to the effect of the magnetic field of the inductor increasing and then collapsing as the capacitor charges and then discharges.

An inductive power transfer may be used to power a device without the need for any direct wired connection between the power source and the device. Inductive power transfer may use a primary coil and a secondary coil. The primary coil may be contained within the device under power. The primary coil may have a current passing through it, which generates a proportional magnetic field around the primary coil. If a secondary coil is placed within the primary coil's magnetic field, the electromagnetic waves generated by the current passing through the primary coil cause a current to be induced through the secondary coil. This process is known as magnetic induction. The current in the secondary coil may then be utilized to power another device that is coupled to the secondary coil. The secondary coil may be contained, for example, within a receiving system that may be powered through this process of magnetic induction. When the receiving device is placed near the primary coil, power may be inductively transferred from the primary coil to the secondary coil, with no direct electrical (wired) connection between the coils. Common examples of commercially available devices that use this type of inductive charging include cordless toothbrushes.

It is desirable to apply the above principles to the field of wearable computers, such as by using items of jewelry as controllers for computer applications, including but not limited to gaming software.

BRIEF DESCRIPTION OF THE DRAWINGS

By way of example, reference will now be made to the accompanying drawings, which are not to scale.

DETAILED DESCRIPTION

Figure 1A:
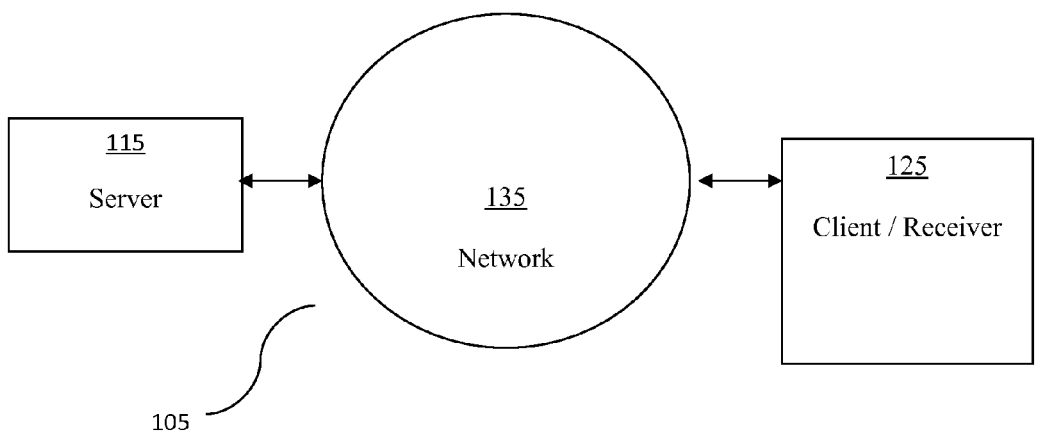
FIG. 1A illustrates an exemplary networked environment and its relevant components according to certain embodiments of the present invention.

Those of ordinary skill in the art will realize that the following description of certain embodiments is illustrative only and not in any way limiting. Other embodiments will readily suggest themselves to such skilled persons, having the benefit of this disclosure. Reference will now be made in detail to specific implementations as illustrated in the accompanying drawings. The same reference numbers will be used throughout the drawings and the following description to refer to the same or like parts.

Certain embodiments include methods and systems of using variable inductor and capacitor (LC) tank circuits with the use of inductive power transfer to power LC tank circuits and, more specifically according to certain embodiments, to methods and systems involving a piece of jewelry such as a watch or a bracelet worn on a wrist of a user that may contain a coil for generating a magnetic field to inductively power a second piece of jewelry such as a ring that may contain an LC tank circuit that may oscillate at a resonant frequency. According to certain embodiments, an antenna and tuning circuits for tuning to a LC tank circuit's resonant frequency may be integrated within the system to detect a frequency based on the user's movement of a particular piece of jewelry (such as a ring which may contain an LC tank circuit that may oscillate at a particular resonant frequency), to provide one or more control inputs to a computer application, including without limitation to control game moves of a character for use with heads-up displays (HUDs) for augmented reality applications.

In certain embodiments, the invention provides a mechanism that allows for use of variable inductor and capacitor (LC) tank circuits that may be integrated as part of a user's jewelry, such as rings that may be worn on one or more fingers of the user which may have the capability to vary the oscillation frequency of each ring as an input for controlling part of a game. Each of the tuned LC tank circuits that may be integrated as jewelry, such as a ring, may be moved within the magnetic field of a primary coil that may be part of another piece of jewelry such as a watch or a bracelet, worn on a wrist of a user. The primary coil may be integrated as jewelry and may be powered from a power source connected to the jewelry. Current may flow through the primary coil on the jewelry. The primary coil may induce a magnetic field around the secondary coil of the inductor on the LC tank circuit of a ring that may be on the finger of the user, which then may transfer power to the LC tank circuit. If powered, the LC tank circuit may oscillate at its resonant frequency. In certain embodiments, antenna and tuning circuits for tuning to a LC tank circuit's frequency may be integrated within the system.

In certain embodiments, an input device is disclosed, comprising a first piece of jewelry comprising a power source and a primary coil for generating a magnetic field, a second piece of jewelry comprising an LC tank circuit that oscillates at a first resonant frequency when placed within the magnetic field, and a receiver for receiving a signal and determining whether the signal comprises a match. The receiver may comprise an antenna and a tuning circuit to detect the first resonant frequency in the signal. Without limitation, the first and second pieces of jewelry may be any combination of watches, bracelets, or rings. In certain embodiments, the signal match may comprise the first resonant frequency. In certain embodiments, the second piece of jewelry may comprise at least one of a variable inductor and a variable capacitor for varying the first resonant frequency.

In certain embodiments, the input device may further includes one or more additional pieces of jewelry. In certain embodiments, the one or more additional pieces of jewelry each may include an additional LC tank circuit that oscillates at an additional resonant frequency when placed within the magnetic field. In certain embodiments, at least one of the additional pieces of jewelry may include at least one of a variable inductor and a variable capacitor for varying the additional resonant frequency.

In certain embodiments, a method is disclosed for providing input to a computer game, including providing a first piece of jewelry comprising a power source and a primary coil, generating a current in the primary coil to generate a magnetic field, providing a second piece of jewelry comprising an LC tank circuit, moving the second piece of jewelry into the magnetic field of the primary coil to cause the second piece of jewelry to oscillate at a first resonant frequency, receiving a signal from the second piece of jewelry, and determining if the signal comprises a signal match.

In certain embodiments, the first piece of jewelry may comprise a selected one of a watch, a bracelet and a ring. In certain embodiments, the second piece of jewelry may comprise a ring. In certain embodiments, the second piece of jewelry may comprise at least one of a variable inductor and a variable capacitor for varying the first resonant frequency.

In certain embodiments, the signal match may include any frequency. In certain embodiments, the signal match may include the first resonant frequency.

In certain embodiments, the method may further include providing one or more additional pieces of jewelry. At least one of the additional pieces of jewelry may be moved into the magnetic field to cause it to oscillate at an additional resonant frequency. In certain embodiments, at least one of the additional pieces of jewelry may include at least one of a variable inductor and a variable capacitor for varying the additional resonant frequency.

Certain figures in this specification are flow charts illustrating methods and systems. It will be understood that each block of these flow charts, and combinations of blocks in these flow charts, may be implemented by computer program instructions. These computer program instructions may be loaded onto a computer or other programmable apparatus to produce a machine, such that the instructions which execute on the computer or other programmable apparatus create structures for implementing the functions specified in the flow chart block or blocks. These computer program instructions may also be stored in a computer-readable memory that can direct a computer or other programmable apparatus to function in a particular manner, such that the instructions stored in the computer-readable memory produce an article of manufacture including instruction structures which implement the function specified in the flow chart block or blocks. The computer program instructions may also be loaded onto a computer or other programmable apparatus to cause a series of operational steps to be performed on the computer or other programmable apparatus to produce a computer implemented process such that the instructions which execute on the computer or other programmable apparatus provide steps for implementing the functions specified in the flow chart block or blocks.

Accordingly, blocks of the flow charts support combinations of structures for performing the specified functions and combinations of steps for performing the specified functions. It will also be understood that each block of the flow charts, and combinations of blocks in the flow charts, can be implemented by special purpose hardware-based computer systems which perform the specified functions or steps, or combinations of special purpose hardware and computer instructions.

For example, any number of computer programming languages, such as C, C++, C# (CSharp), Perl, Ada, Python, Pascal, SmallTalk, FORTRAN, assembly language, and the like, may be used to implement certain embodiments. Further, various programming approaches such as procedural, object-oriented or artificial intelligence techniques may be employed, depending on the requirements of each particular implementation. Compiler programs and/or virtual machine programs executed by computer systems may translate higher level programming languages to generate sets of machine instructions that may be executed by one or more processors to perform a programmed function or set of functions.

The term "machine-readable medium" should be understood to include any structure that participates in providing data which may be read by an element of a computer system.

Such a medium may take many forms, including but not limited to, non-volatile media, volatile media, and transmission media. Non-volatile media include, for example, optical or magnetic disks and other persistent memory. Volatile media include dynamic random access memory (DRAM) and/or static random access memory (SRAM). Transmission media include cables, wires, and fibers, including the wires that comprise a system bus coupled to processor. Common forms of machine-readable media include, for example, a floppy disk, a flexible disk, a hard disk, a magnetic tape, any other magnetic medium, a CD-ROM, a DVD, any other optical medium.

FIG. 1A depicts an exemplary networked environment 105 in which systems and methods, consistent with exemplary embodiments, may be implemented. As illustrated, networked environment 105 may include a server 115, a client/receiver 125, and a network 135. The exemplary simplified number of servers 115, clients/receivers 125, and networks 135 illustrated in FIG. 1A can be modified as appropriate in a particular implementation. In practice, there may be additional servers 115, clients/receivers 125, and/or networks 135.

Network 135 may include one or more networks of any type, including a Public Land Mobile Network (PLMN), a telephone network (e.g., a Public Switched Telephone Network (PSTN) and/or a wireless network), a local area network (LAN), a metropolitan area network (MAN), a wide area network (WAN), an Internet Protocol Multimedia Subsystem (IMS) network, a private network, the Internet, an intranet, and/or another type of suitable network, depending on the requirements of each particular implementation.

One or more components of networked environment 105 may perform one or more of the tasks described as being performed by one or more other components of networked environment 105.

Figure 1B:
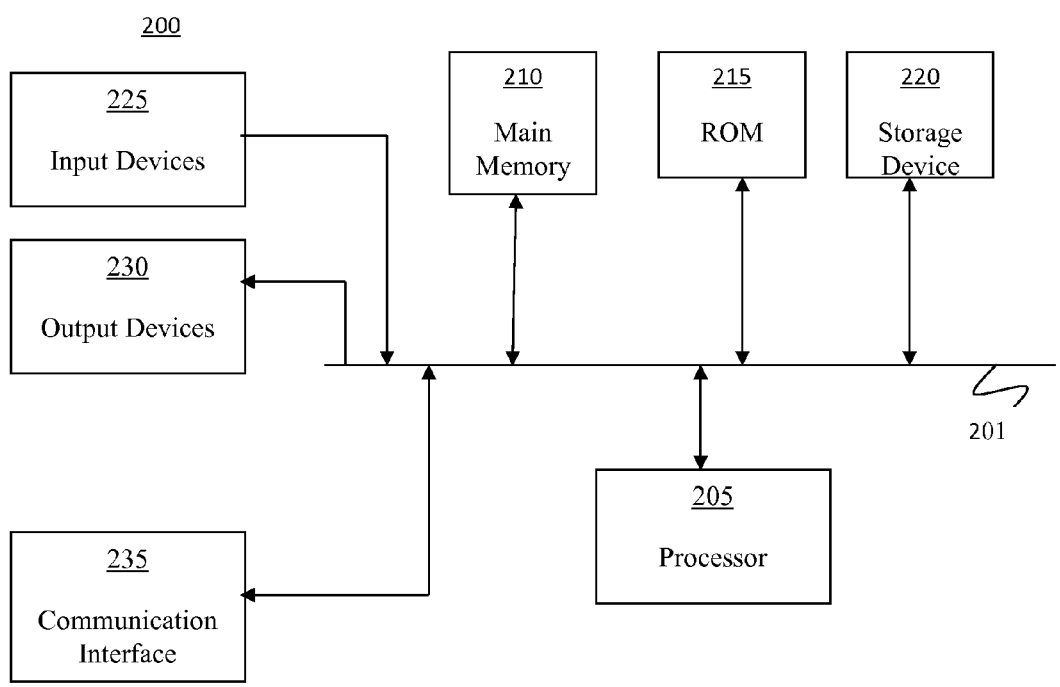
FIG. 1B is an exemplary block diagram of a computing device that may be used to implement certain embodiments of the present invention.

FIG. 1B is an exemplary diagram of a computing device 200 that may be used to implement certain embodiments, such as aspects of server 115 or of client/receiver 125. Computing device 200 may include a bus 201, one or more processors 205, a main memory 210, a read-only memory (ROM) 215, a storage device 220, one or more input devices 225, one or more output devices 230, and a communication interface 235. Bus 201 may include one or more conductors that permit communication among the components of computing device 200.

Processor 205 may include any type of conventional processor, microprocessor, or processing logic that interprets and executes instructions. Main memory 210 may include a random-access memory (RAM) or another type of dynamic storage device that stores information and instructions for execution by processor 205. ROM 215 may include a conventional ROM device or another type of static storage device that stores static information and instructions for use by processor 205. Storage device 220 may include a magnetic and/or optical recording medium and its corresponding drive.

Input device(s) 225 may include one or more conventional mechanisms that permit a user to input information to computing device 200, such as a keyboard, a mouse, a pen, a stylus, handwriting recognition, voice recognition, biometric mechanisms, and the like. Output device(s) 230 may include one or more conventional mechanisms that output information to the user, including a display, a projector, an A/V receiver, a printer, a speaker, and the like. Communication interface 235 may include any transceiver-like mechanism that enables computing device/server 200 to communicate with other devices and/or systems. For example, communication interface 235 may include mechanisms for communicating with another device or system via a network, such as network 135 as shown in FIG. 1A.

As will be described in detail below, computing device 200 may perform operations based on software instructions that may be read into memory 210 from another computer-readable medium, such as data storage device 220, or from another device via communication interface 235. The software instructions contained in memory 210 cause processor 205 to perform processes that will be described later. Alternatively, hardwired circuitry may be used in place of or in combination with software instructions to implement processes consistent with the present invention. Thus, various implementations are not limited to any specific combination of hardware circuitry and software.

Certain embodiments of the present invention described herein are discussed in the context of the global data communication network commonly referred to as the Internet. Those skilled in the art will realize that embodiments of the present invention may use any other suitable data communication network, including without limitation direct point-to-point data communication systems, dial-up networks, personal or corporate Intranets, proprietary networks, or combinations of any of these with or without connections to the Internet.

Figure 2A:
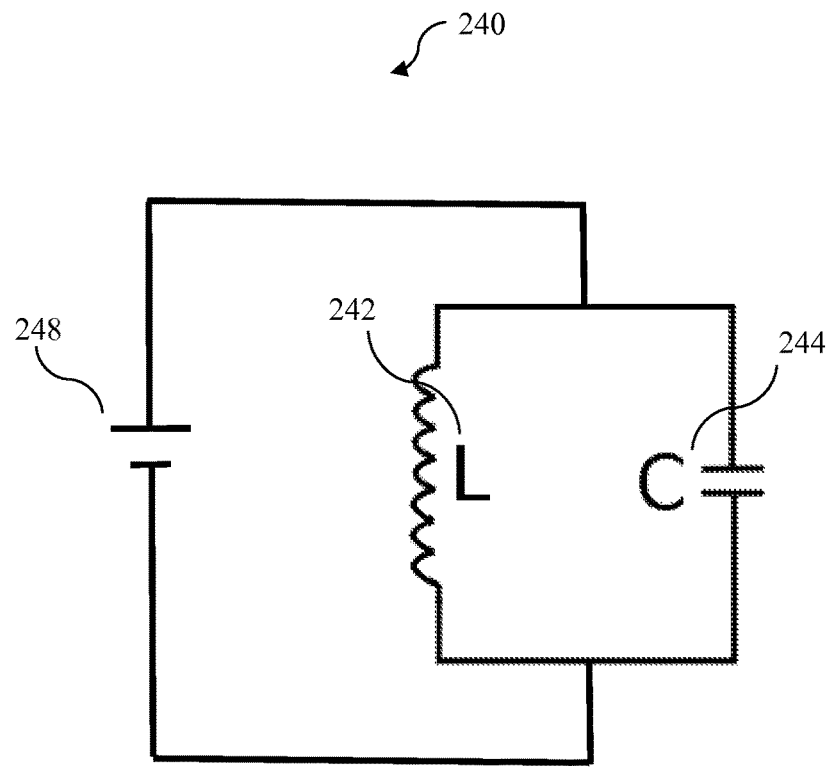
FIG. 2A depicts a typical powered LC tank circuit.

FIG. 2A depicts a typical powered LC tank circuit 240, comprising an inductor 242 and a capacitor 244 in parallel. The circuit 240 may be powered by a battery or a power source 248 as shown. The circuit 240 when powered may oscillate at its resonant frequency. The resonant frequency may be determined by the capacitance of the capacitor 244 and the inductance of the inductor 242. The oscillation may be due to the magnetic field of the inductor increasing and then collapsing as the capacitor charges and then discharges. The circuit 240 depicted in FIG. 2A may sometimes be referred as a LC tank circuit, a tank circuit, a tuned circuit, or a resonant circuit (among other names) and may typically be used to perform tuning functions on a radio receiver.

Figure 2B:
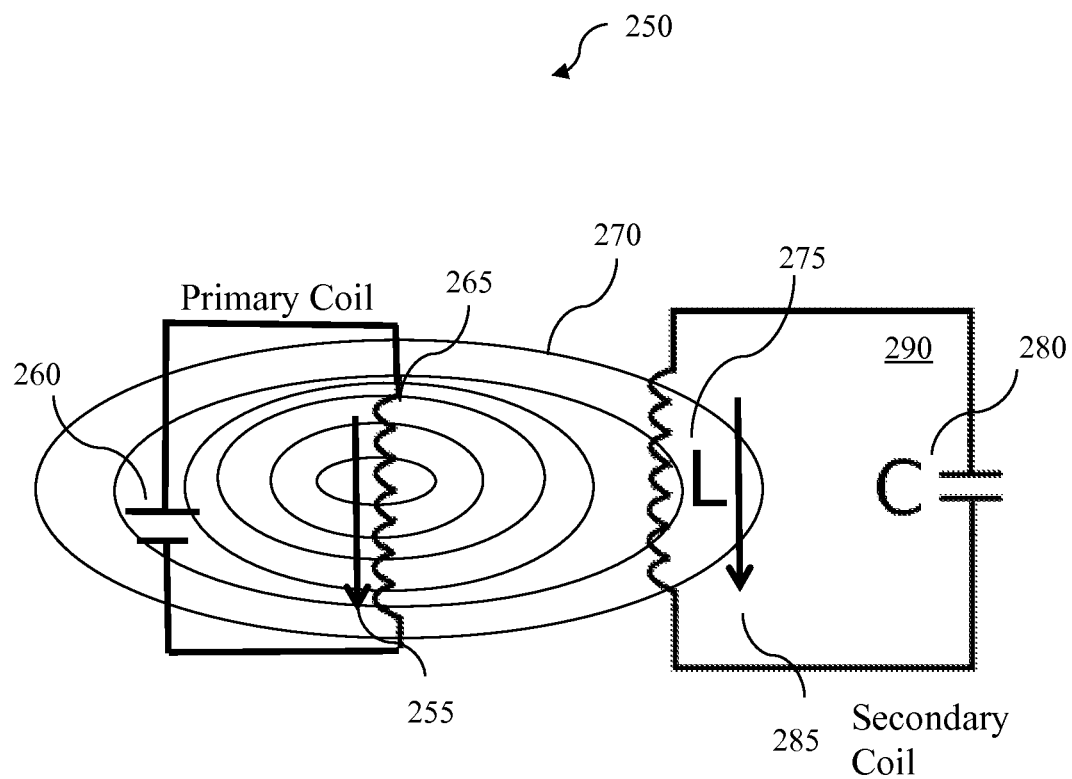
FIG. 2B depicts a primary coil with a magnetic field coupling to a LC tank circuit in accordance with certain embodiments of the present invention.

FIG. 2B depicts a circuit 250 with a primary coil 265 attached to a power source 260. When powered by a power source 260 a current 255 may be generated through the primary coil 265. The current 255 when flowing through the primary coil 265 may generate a magnetic field 270. If the magnetic field 270 overlaps another coil 275, sometimes called a secondary coil, a current 285 in the secondary coil 275 may be induced. The coupling of the primary coil's 265 magnetic field 270 to the secondary coil 275 may be able to power another device. This mechanism may be referred to as inductive power transfer, since the second circuit 290 may be powered from the magnetic field 270 of the primary coil 265 without the use of any direct connection between the primary coil 265 and the second circuit 290. In FIG. 2B, the device 290 may be a LC tank circuit that when powered may oscillate at a resonant frequency that may be dependent on the inductance L of the coil 275 and the capacitance C of the capacitor 280. The frequency at which the circuit 290 oscillates may be said to be the resonant frequency of the circuit.

Figure 3:
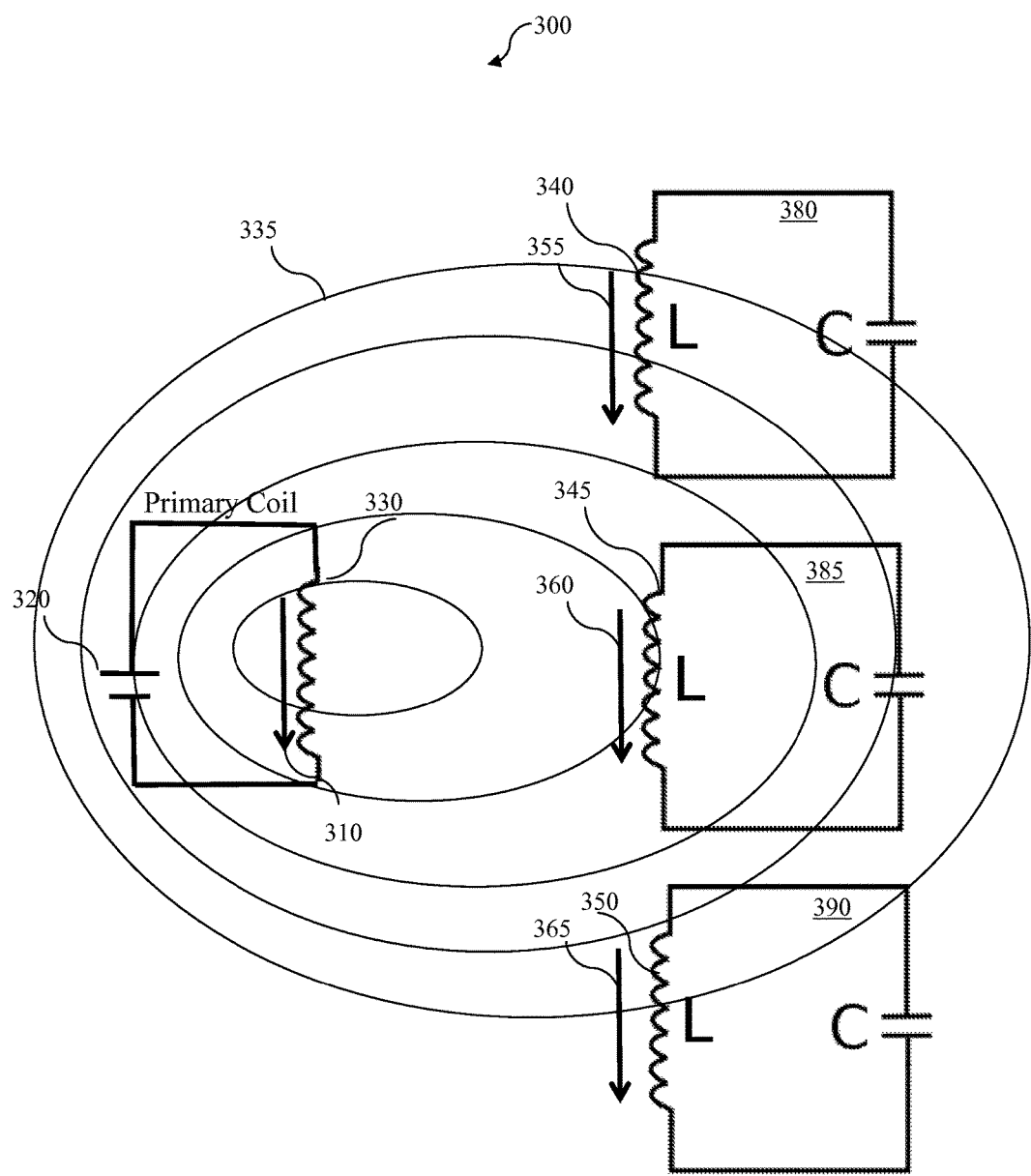
FIG. 3 depicts a primary coil with a magnetic field coupling to multiple LC tank circuits in accordance with certain embodiments of the present invention.

FIG. 3 depicts a circuit 300 with a primary coil 330 attached to a power source 320, inductively coupled to multiple secondary coils according to certain embodiments. When powered by a power source 320, the circuit may generate a current 310 flowing through the primary coil 330. The current 310 flowing through the primary coil 330 may generate a magnetic field 335. If the magnetic field 335 overlaps secondary coils 340, 345, and 350, a current 355, 360, and 365 in each of the respective secondary coils 340, 345, and 350 may be induced. The coupling of the primary coil's magnetic field 335 to the secondary coils 340, 345, and 350 respectively may be able to power other devices 380, 385 and 390 respectively. Therefore, each secondary coil that may be within the magnetic field of the primary coil 330 may have current induced into secondary coils 340, 345 or 350. In FIG. 3, the three devices 380, 385, and 390 may comprise LC tank circuits. When each of the LC tank circuits is powered, it may each oscillate at a frequency that may be dependent on the inductance of the inductor and the capacitance of the capacitor of each circuit. The frequency at which each of the three circuits oscillate may be said to be the resonant frequency of each circuit. There may be other combinations of other types of circuits that may be powered and other combinations of the numbers of circuits that may have inductive power transferred to them. For example, FIG. 3 shows three circuits 380, 385, and 390 that may have current induced into each of the secondary coils.

Figure 4:
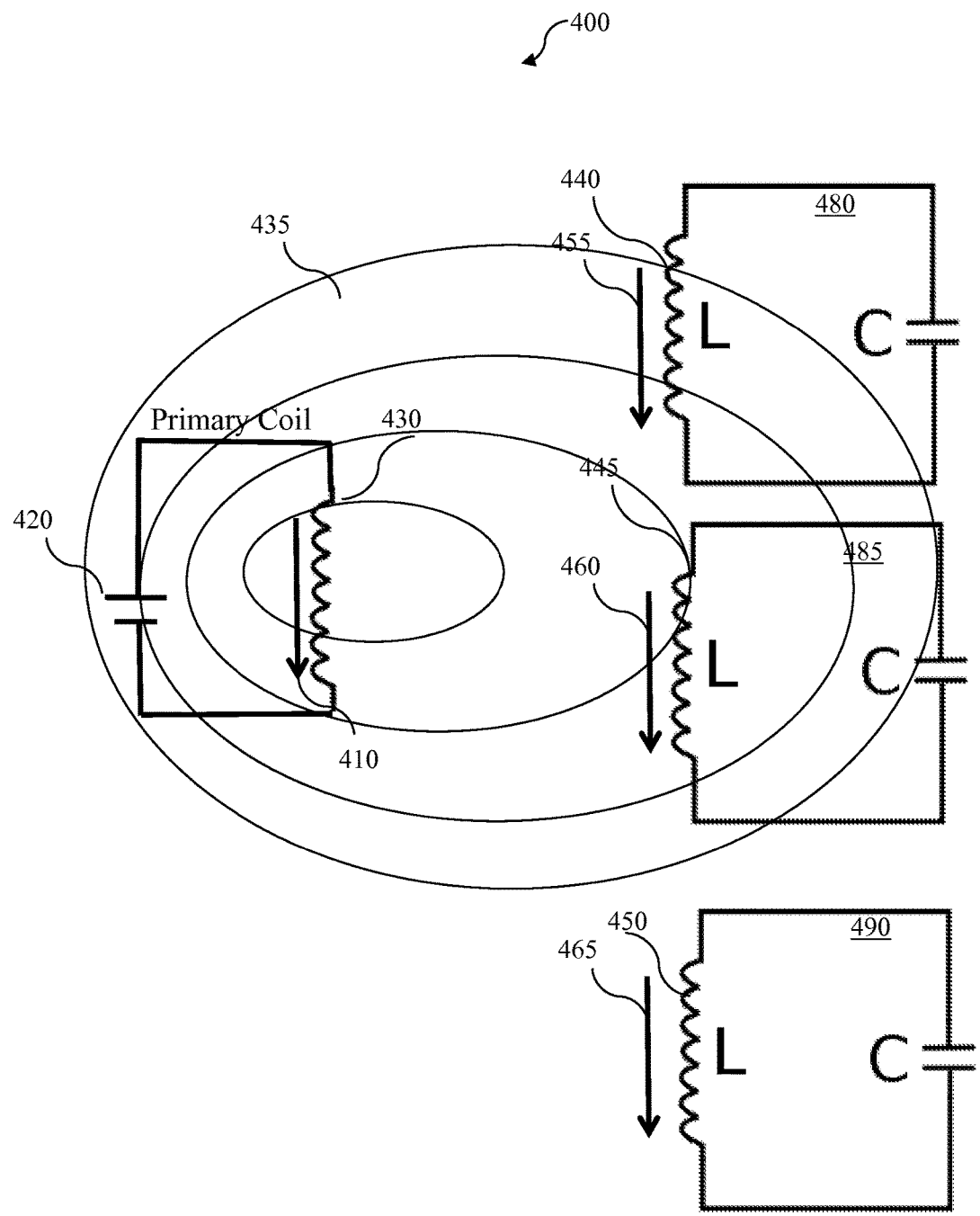
FIG. 4 depicts a primary coil with a magnetic field coupling to multiple LC tank circuits and not coupling to another LC tank circuit in accordance with certain embodiments of the present invention.

FIG. 4 depicts a circuit 400 with a primary coil 430 attached to a power source 420 according to other aspects of the invention. When powered by a power source 420, the primary coil 430 may generate a current 410 flowing through the primary coil 430. The current 410 when flowing through the primary coil 430 may generate a magnetic field 435. If the magnetic field 435 overlaps secondary coils 440 and 445, a current 455 and 460 in each of the secondary coils 440 and 445 may be induced. The coupling of the primary coil's magnetic field 435 to the secondary coils 440 and 445 may be able to power other devices 480 and 485 respectively. Therefore, a secondary current may be induced in each secondary coil 440 and 445 that may be within the magnetic field of the primary coil 430. In FIG. 4, the two devices 480 and 485 may comprise LC tank circuits. When each of circuits 480 and 485 are powered, they may each oscillate at a frequency that may be dependent on the inductance of the inductor and the capacitance of the capacitor of each circuit. The frequency at which each of the circuits 480 and 485 oscillate may be said to be the resonant frequency of each circuit. In certain embodiments, there may be other combinations of other types of circuits that may be powered and other combinations of the numbers of circuits that may have inductive power transferred to them. For example, FIG. 4 shows two circuits 480 and 485 that may have current induced into each of the secondary coils. FIG. 4 also depicts a third circuit 490 that does not overlap with the magnetic field 435 of the primary coil. In this case, the third circuit 390 may not be inductively powered and therefore the third circuit, which may comprise a LC tank circuit, does not oscillate. In certain embodiments, there may be more or fewer circuits than just the two LC tank circuits shown in FIG. 4 (480 and 485) that may be inductively coupled with primary coil 430, and also more circuits than just the one LC tank circuit shown in FIG. 4 (490) that may not be inductively coupled to the primary coil 430.

Certain embodiments may take advantage of the proximity of a secondary coil of a LC tank circuit with respect to a primary coil's magnetic field. Moving a secondary coil of a LC tank circuit within range of the primary coil's magnetic field may cause it to start to oscillate. Conversely, moving that secondary coil out of the range of the primary coil's magnetic field may cause it to stop oscillating. According to certain embodiments, as described herein, detection/decision circuitry may sense information regarding the relative position of one or more secondary coils with respect to a primary coil (which may be based on the relative strength of one or more signals generated as a result of the oscillation or non-oscillation of those secondary coils) and convert that information to a set of control signals to be transmitted to a system that is to be controlled, such as a computer game.

Thus, aspects of the present invention comprise one or more detection circuits for sensing whether one or more secondary coils are located within the magnetic field of a primary coil. In certain embodiments, the one or more detection circuits may sense that one or more of the secondary coils is oscillating at its resonant frequency, indicating that the particular one or more secondary coils is within range of the primary coil's magnetic field. In certain embodiments, each of the secondary coils may oscillate at a different resonant frequency when within range of the primary coil's magnetic field. In such embodiments, the one or more detection circuits may be able to detect which one or more secondary coils is within the range of the magnetic field of the primary coil. In certain embodiments, detection of the resonant frequency of a particular secondary coil may be used as an input to a computer application. In certain embodiments, detection of a combination of two or more resonant frequencies corresponding to two or more secondary coils may be used as an input to a computer application. One of ordinary skill in the art will recognize that a plurality of secondary coils, incorporated for example and without limitation into a plurality of rings, may be used to generate multiple different inputs to a computer application.

In certain embodiments, one or more detection circuits may be used to detect changes in the current in the primary coil that may be caused by moving one or more secondary coils within range of the magnetic field of the primary coil. In certain embodiments, the change in the primary coil current may be used as an input to a computer application. In certain embodiments, the change in primary coil current may correspond to a particular secondary coil being within range of the primary coil's magnetic field. In such embodiments, the one or more detection circuits may be able to detect which one or more secondary coils is within the range of the magnetic field of the primary coil. In certain embodiments, detection of a change in primary coil current corresponding to a change related to the coupling of a particular secondary coil with the primary coil may be used as an input to a computer application. In certain embodiments, detection of a change in primary coil current corresponding to a change related to the coupling characteristics of a combination of two or more secondary coils with respect to the primary coil may be used as an input to a computer application. One of ordinary skill in the art will recognize that a plurality of secondary coils, incorporated for example and without limitation into a plurality of rings, may be used a variety of discrete changes in primary coil current that may be used to generate multiple different inputs to a computer application.

For example, if in a particular embodiment there are five pieces of jewelry which contain LC tank circuits and none of the secondary coils of the LC tank circuits are within the magnetic field of the primary coil, then none of the LC tank circuits may oscillate. In certain implementations, if a user desires to move a character forward in a game, the user may move at least one piece of jewelry which contains an LC tank circuit with a secondary coil closer to the powered primary coil so that it may oscillate at a specific resonant frequency to generate a control signal to be transmitted to the game to move the character in the desired direction. In certain embodiments of the invention, the game may require a particular piece of jewelry which contains a LC tank circuit to oscillate at its certain resonant frequency. Alternately, a signal to the game may be generated by causing a particular piece of jewelry which contains a LC tank circuit to stop oscillating. The user in this case may move the piece of jewelry that contains the LC tank circuit out of the range of the magnetic field of the primary coil.

Figure 5:
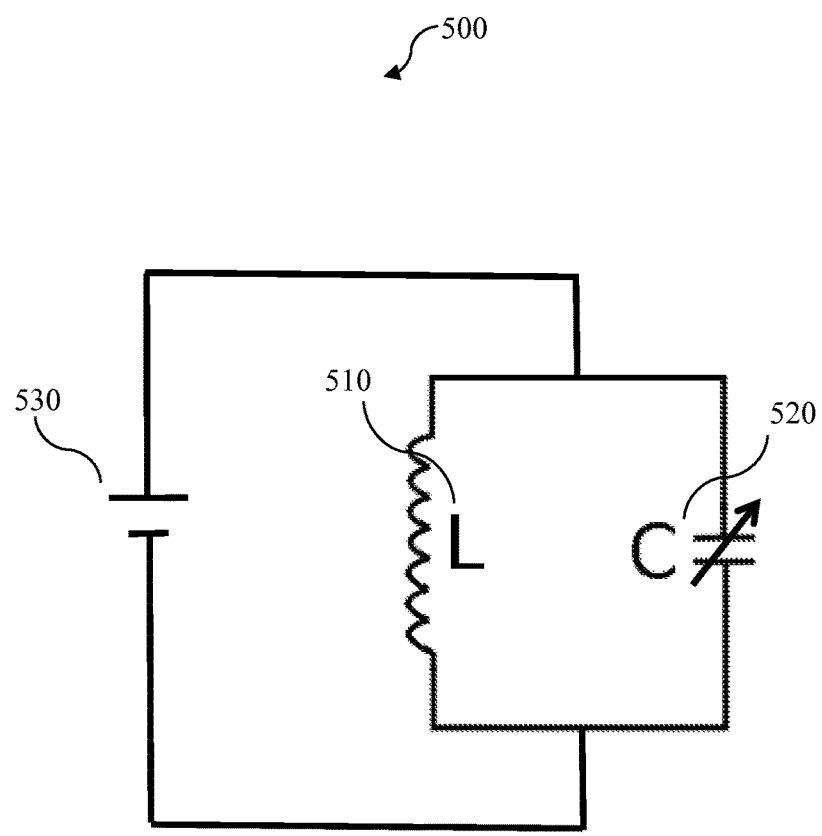
FIG. 5 depicts a powered LC tank circuit that has a variable capacitor to control the resonant frequency of the circuit in accordance with certain embodiments of the present invention.

In certain embodiments, a signal may be generated and transmitted to a decision circuit by a particular piece of jewelry which contains a LC tank circuit that has a secondary coil that oscillates at a particular frequency. This may be accomplished by moving the piece of jewelry which contains the LC tank circuit that has a secondary coil within the magnetic field of the primary coil and adjusting the resonant frequency of the LC tank circuit. FIG. 5 depicts a typical powered LC tank circuit 500 comprising an inductor 510 and a variable capacitor 520 in parallel according to certain embodiments. The LC tank circuit 500 may be powered by a power source 530, such as a magnetic field (e.g., magnetic field 435). The LC tank circuit 500 when powered by a power source 530 may oscillate at its resonant frequency. The resonant frequency of the LC tank circuit 500 may be determined by the capacitance of the capacitor 520 and the inductance of the inductor 510. The resonant frequency of the LC tank circuit 500 as depicted in FIG. 5 may be adjusted by changing the capacitance value of variable capacitor 520. Since the resonant frequency may be dependent on the combination of inductance of the inductor 510 and the variable capacitor 520, varying the variable capacitor's 520 capacitance may change the resonant frequency of the LC tank circuit.

Figure 6:
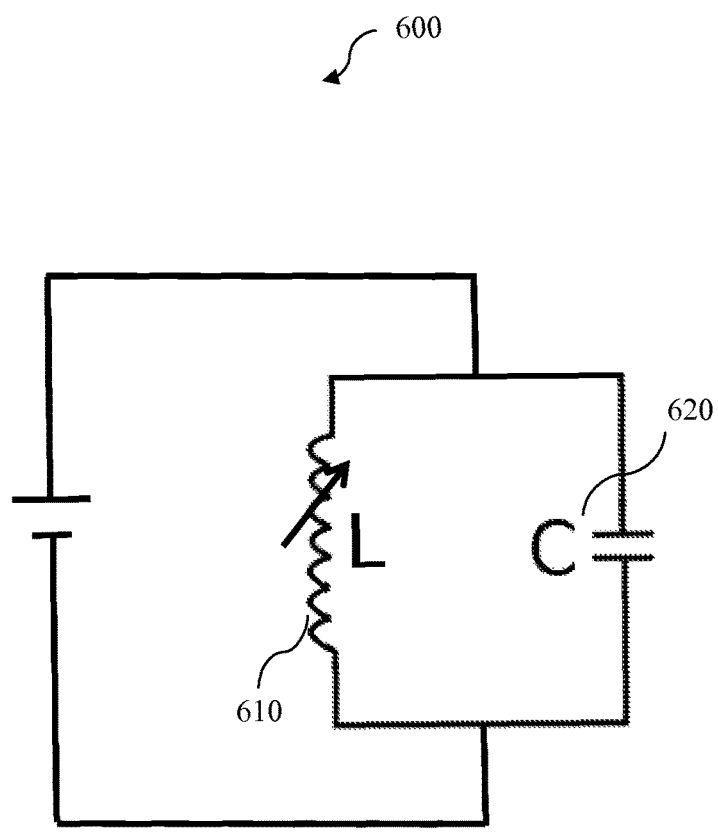
FIG. 6 depicts a powered LC tank circuit that has a variable inductor to control the resonant frequency of the circuit in accordance with certain embodiments of the present invention.

FIG. 6 shows powered LC tank circuit 600 with a variable inductor according to certain embodiments. To adjust the resonant frequency of the LC tank circuit 600, a variable inductor 610 may combined with a constant capacitance capacitor 620, instead of using a variable capacitor as in FIG. 5. Since the resonant frequency may be dependent on the inductance of the combination of variable inductor 610 and capacitor 620, varying the inductance value of variable inductor 610 may change the resonant frequency of the LC tank circuit.

Figure 7:
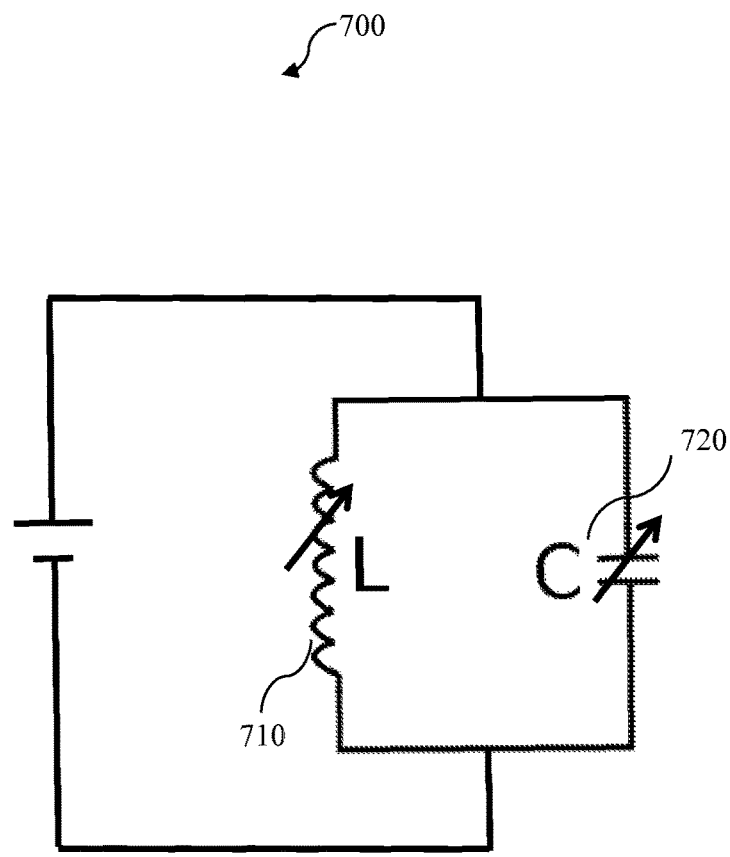
FIG. 7 depicts a powered LC tank circuit that has a variable capacitor and a variable inductor to control the resonant frequency of the circuit in accordance with certain embodiments of the present invention.

FIG. 7 shows a powered LC tank circuit 700 with a variable inductor and a variable capacitor according to aspects of the present invention. To adjust the resonant frequency of the LC tank circuit 700, a variable inductor 710 may be combined with a variable capacitor 720. Since the resonant frequency may be dependent on combination of the inductance of the variable inductor 710 and the capacitance of the variable capacitor 720, varying the variable inductor's 710 inductance and/or the variable capacitor's 720 capacitance may change the resonant frequency of the LC tank circuit.

Figure 8:
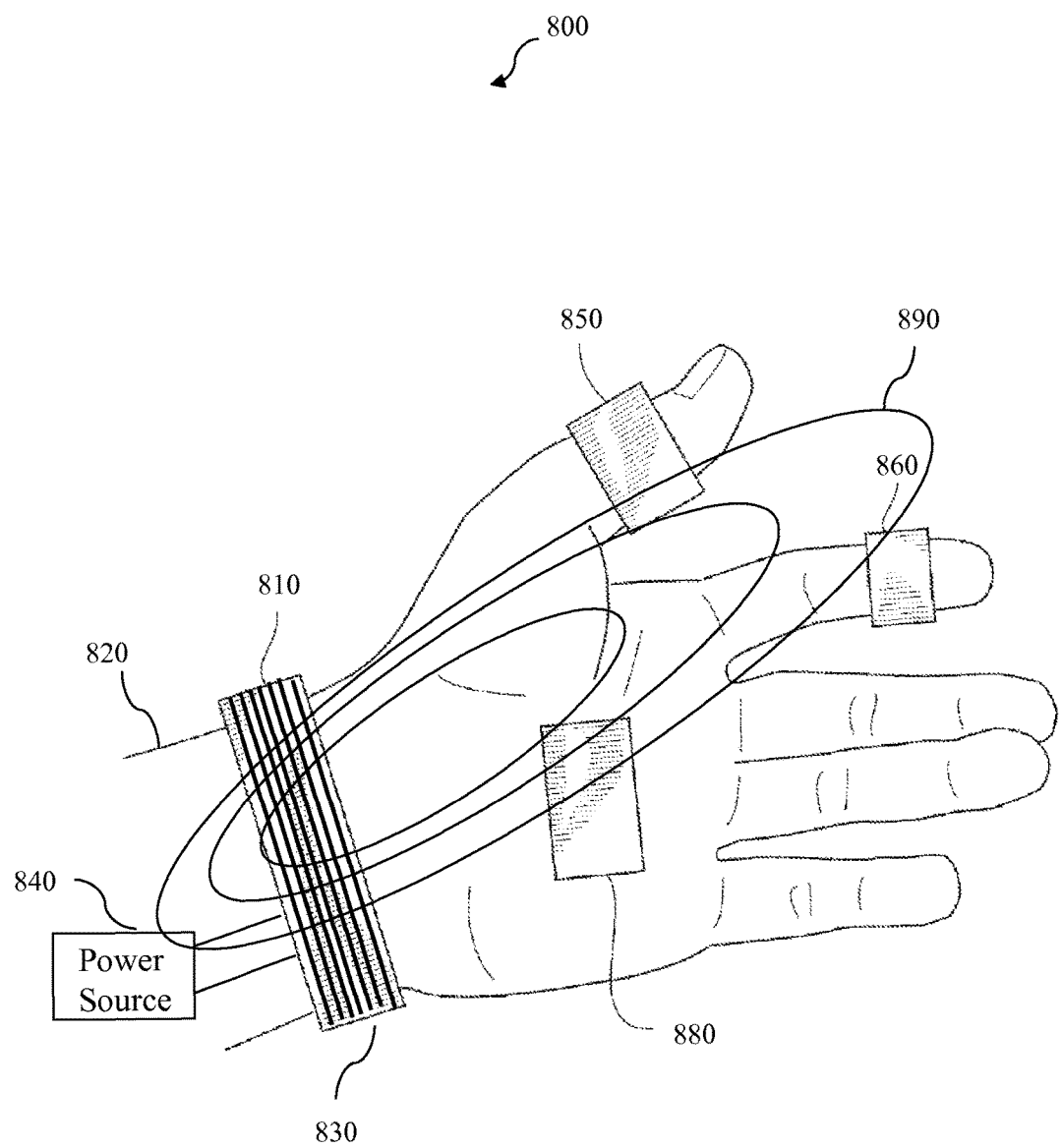
FIG. 8 depicts a user's hand with a primary coil around the wrist and LC tank circuits on the fingers in accordance with certain embodiments of the present invention.

FIG. 8 depicts a user's hand with a primary coil around the wrist and LC tank circuits on the fingers in accordance with certain embodiments of the present invention. A piece of jewelry 810 such as a watch or a bracelet may be worn on a wrist 820 of a user. A primary coil 830 wrapped around the wrist may be integral to the piece of jewelry 810 around the wrist and may be powered by a power source 840 which may be, without limitation, one or more batteries, and which may be included within jewelry 810 worn on the user's wrist 820. When powered, a current may be induced within coil 830, which may generate a magnetic field 890 around coil 830, the primary coil in this case.

As shown in FIG. 8, items of jewelry 850 and 860 may be implemented as rings which may be worn by the user. Item of jewelry 880 may be implemented as another form of jewelry such a piercing, or may comprise a piece of jewelry or other object that may be held by the user's palm. For example, the items of jewelry used in a particular implementation may comprise two rings, each containing an LC tank circuit with a secondary coil, but there may be any number of rings or other jewelry that each contain LC tank circuits with a secondary coil that may be within the magnetic field 890. Each ring may comprise an inductor and a capacitor in parallel, comprising an LC tank circuit as shown on FIG. 2B, where L 275 represents the inductor and C 280 represents the capacitor.

In certain embodiments, the capacitor in a given LC tank circuit may become charged inductively when the primary coil 830 generates a magnetic field 890 and a corresponding ring (850 and/or 860) is moved to be within the magnetic field 890. Referring to FIGS. 8 and 2B, the magnetic field 890 may induce a current 285 within inductor 275 within any of the rings 850 or 860 when the inductor 275 of the appropriate secondary coil, becomes located within the magnetic field 890 of the primary coil 830. When current 285 is flowing, the LC tank circuit 290 in any of rings 850 and/or 860 that are within magnetic field 890 may begin to oscillate at its respective resonant frequency. In certain embodiments, power source 840 may cause an inductive power transfer from to any of rings 850 and/or 860 that are within magnetic field 890.

The LC tank circuit 290 of each of rings 850 and/or 860 may remain oscillating so long as the respective circuit remains powered by the inductive power transfer from the primary coil 830. This oscillation may be detected by an antenna system that may be tuned for the particular resonant frequency of a given LC tank circuit, as further discussed with reference to FIG. 9.

According to certain embodiments, FIG. 8 depicts a magnetic field 890 and a particular implementation involving three pieces of jewelry (850, 860, and 880) located on different parts of a user's hand. By moving the user's fingers and/or hand (such as by rotating the user's wrist or extending one or more fingers) the pieces of jewelry 850, 860, and 880 may be moved selectively into and out of the magnetic field 890. By moving the hand and fingers out of the magnetic field 890, the inductive coupling between the magnetic field 890 and one or more pieces of jewelry 850, 860, and 880 may be interrupted. Conversely, by moving the user's hand and/or fingers such that one or more of the items of jewelry 850, 860, and/or 880 move within magnetic field 890, the inductive coupling between the magnetic field 890 and the corresponding pieces of jewelry may be established. Therefore, the user may control the inductive coupling of each piece of jewelry (850, 860, and 880), by different hand movements.

Figure 9:
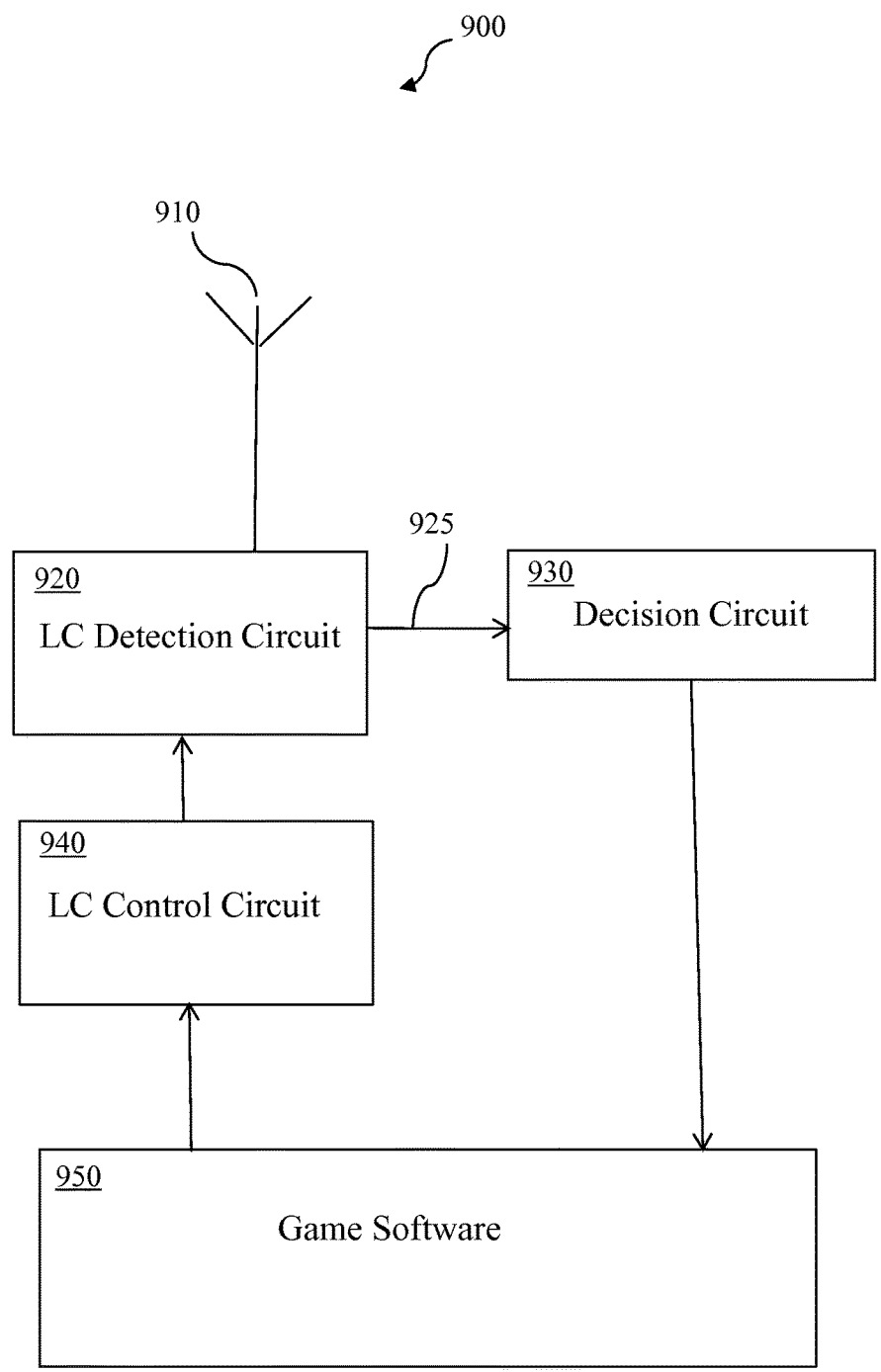
FIG. 9 depicts a block diagram of a receive detection system for detecting a particular frequency in accordance with certain embodiments of the present invention.

In certain embodiments, FIG. 9 depicts a system block diagram for circuitry to detect the LC tank circuitry oscillation according to certain embodiments. The circuitry depicted by system 900 may be located, for example and without limitation, within a heads up display (HUD) apparatus, or on the wrist of the user. As shown in FIG. 9, system 900 comprises an antenna 910 that is coupled to a LC Detection Circuit 920. The LC Detection Circuit 920 is coupled to LC Control Circuit 940, which transmits information to LC Detection Circuit 920 relating to the frequency or frequencies of interest with respect to one or more LC tank circuits. The LC Control Circuit 940 may communicate with game software 950. A user may generate an input to a game, which may include without limitation a signal to a game to cause a character in the game to move in a desired direction, by moving at least one piece of jewelry, such as a ring worn by the user that containing an LC circuit, into the magnetic field of the primary coil (see items 810/830 in FIG. 8). This movement may cause an LC tank circuit that may be integrated within a piece of jewelry, such as a ring, to oscillate at its resonant frequency. The system 900 may receive a signal at the resonant frequency of an LC tank circuit that may be integrated within a particular ring 850 or 860 via antenna 910. The received signal may then be passed to a LC Detection Circuit 920 connected to the antenna 910. The LC Detection Circuit 920 comprises a tuning circuit and may be tuned to detect the resonant frequency of one or more of the LC tank circuits that may be integrated within jewelry items worn by the user, such as rings 850 or 860. One of ordinary skill in the art will recognize that other types of jewelry that may be worn on, affixed to or otherwise attached to a user may be substituted for the exemplary jewelry described herein without departing the scope of the invention. When the system detects a frequency match between the resonant frequency of one of the rings 850 or 860 and the signal received by the LC Detection Circuit 920, then the LC Detection Circuit 920 may send a match signal 925 to the Decision Circuit 930 to indicate that the correct frequency has been detected by the LC detection circuit 920. The Decision Circuit 930 may then send a signal to the Game Software 950 to provide an input that may, for example, cause a character in the game to move in a desired direction. The Game Software 950 may then allow the game character to move in the desired direction in the game.

In certain embodiments, the game software 950 may inform the LC control Circuit 940 to search for a particular frequency. The user may vary the capacitance and/or inductance of one or more of the rings, which may contain a LC tank circuit, to resonate at the particular frequency and then move the one or more ring into the magnetic field of the primary coil (or vice a versa). Varying the capacitance and/or inductance of the LC tank circuit may cause the LC tank circuit (as discussed with reference to FIGS. 5-7) to resonate at a different frequency when within the primary coil's magnetic field. Therefore, there may be multiple steps that the user may need to perform so that the LC Detection Circuit 920 generates a match signal 925.

The game software 950 may provide a plurality of levels of complexity. The first level of complexity may be to generate a match signal 925 from the LC Detection Circuit 920 if it is determined that a ring that contains a LC tank circuit is oscillating (as discussed further with reference to FIG. 10). The second level of complexity may be to generate a match signal 925 from the LC Detection Circuit 920 if the ring that contains a LC tank circuit is detected to be oscillating at a particular desired frequency (as discussed further with reference to FIG. 11). A third level of complexity may be to generate a match signal 925 from the LC Detection Circuit 920 if a sequence or combination of particular desired frequencies may be detected from multiple rings which each may contain LC tank circuits (as discussed further with reference to FIG. 12). Many additional levels of complexity and other combinations not presented here fall within the scope of the present invention as understood by those of ordinary skill in the art.

Figure 10:
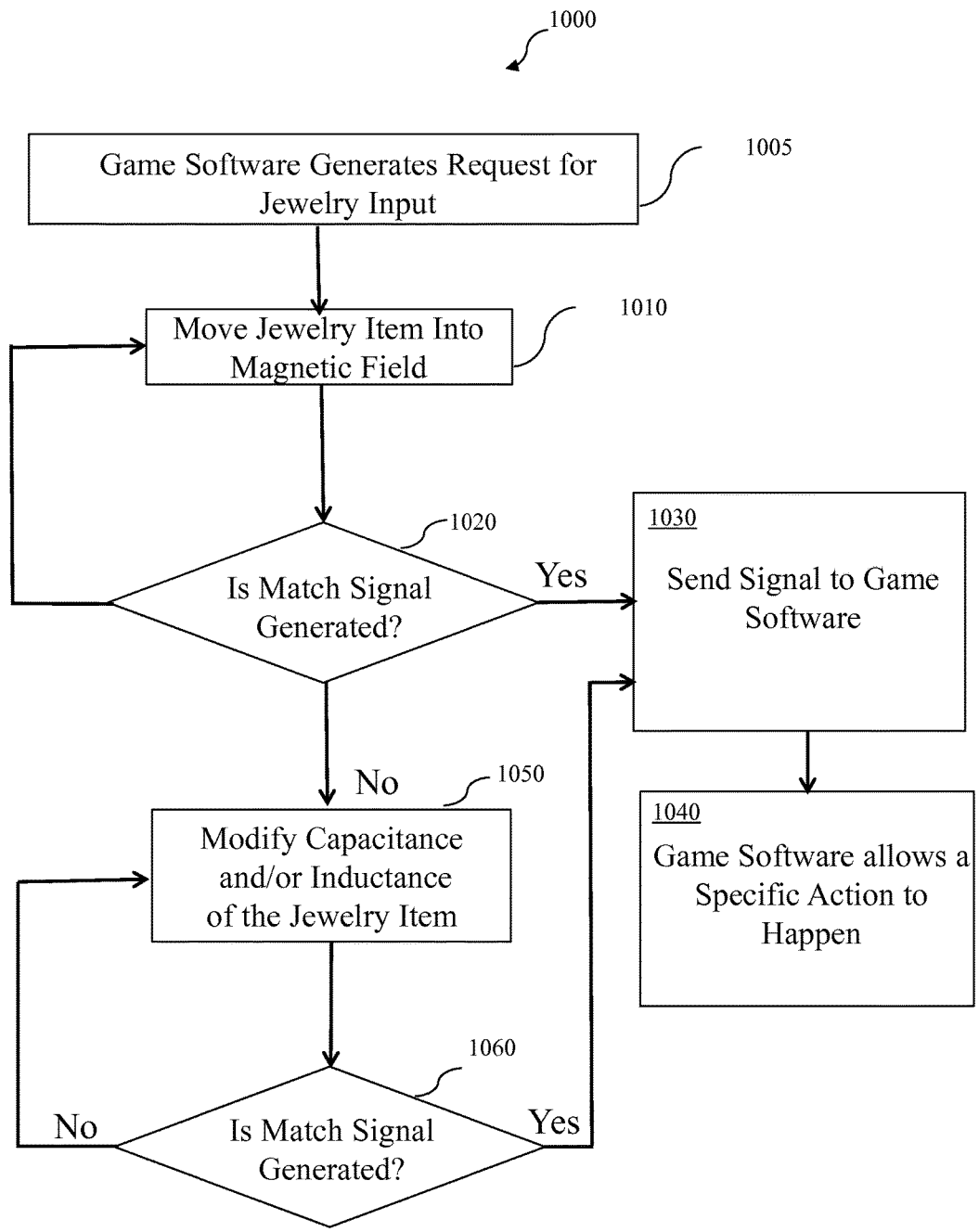
FIG. 10 depicts a flow chart of a receive detection system for detecting input from a particular item of jewelry in accordance with certain embodiments of the present invention.

In certain embodiments, FIG. 10 is a flow chart that depicts an exemplary method 1000 that the user may follow in order to cause a specific action to occur in the game. The game software 950 may generate a request for an input by a specific item of jewelry from a plurality of jewelry items worn by the user (1005). For example, game software 950 may request a user to provide input from a particular ring, say ring 860, so that a game character moves forward in the game.

A user may then move the requested jewelry containing a LC tank circuit within the magnetic field of the primary coil (1010). For e.g., user may move ring 860 within the magnetic field of the primary coil, e.g., worn on the wrist in battery powered jewelry 830. A match signal may be generated 925 from the LC Detection Circuit 920 if it is determined that a ring 860 is oscillating. If a match signal 925 is generated (1020), then the match signal 925 may be sent to the game software 950 (1030).

After this signal is sent to the game software 950, the game software 950 may allow a specific action to happen (1040). For e.g., game software 950 may allow a character (e.g., a character controlled at least by ring 860) to perform a certain action in the game. In another embodiment, game software 950 may allow a character to perform a certain action in the game (e.g., an action controlled at least by ring 860).

However, if a match signal 925 is not generated (1020), then the user may modify at least one of the jewelry's capacitance and/or inductance to modify the resonant frequency of the corresponding LC tank circuit (1050). For e.g., user may modify capacitance if ring 860 includes LC circuit with a variable capacitance, an inductance if ring 860 includes an LC circuit with a variable inductance, or both if ring 860 includes both a variable inductance and a variable capacitance. If a match signal 925 is generated (1060), then the match signal 925 may be sent to the game software 950 (1030). The game software 950 may then respond to the match signal 925 by performing a specific action, e.g., allowing the game character to move forward in the game (1040). If a match signal 925 is not generated (1060), then the user may modify the jewelry's capacitance and/or inductance (1050) until a match signal 925 is generated.

Figure 11:
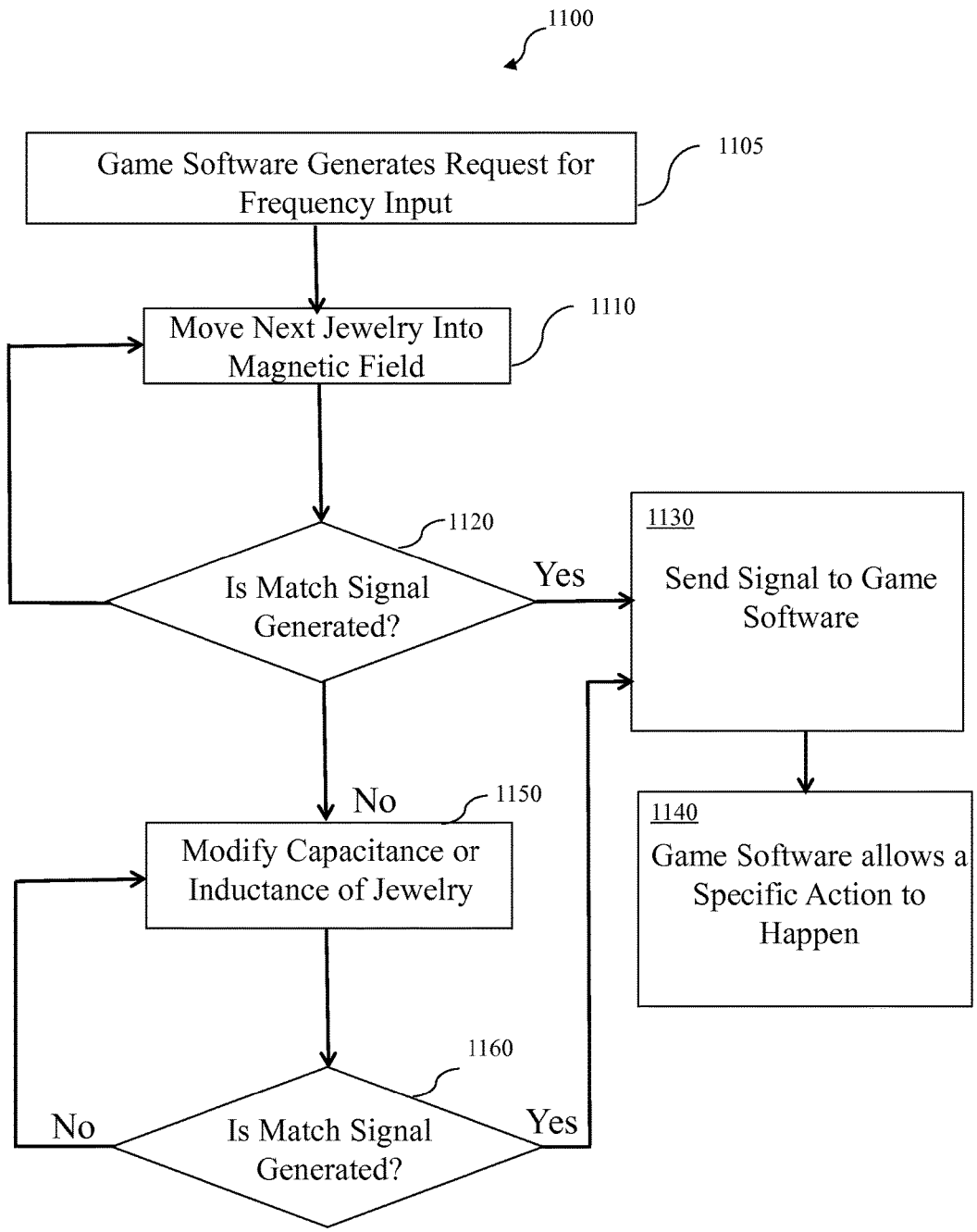
FIG. 11 depicts a flow chart of a receive detection system for detecting input of a particular frequency in accordance with certain embodiments of the present invention.

In certain embodiments, FIG. 11 is a flow chart that depicts an exemplary method 1100 that the user may follow in order to cause a specific action to occur in the game. The game software 950 may generate a request for a specific frequency jewelry input (1105). For example, game software 950 may request a user to provide an input of a particular frequency (or combination of frequencies) so that a game character moves forward in the game, or performs a particular combination of moves or actions.

A user may then move a first piece of jewelry (e.g., ring 860) containing a LC tank circuit within the magnetic field of the primary coil (1110). A match signal 925 may be generated from the LC Detection Circuit 920 if ring 860 is detected to be oscillating at a particular desired frequency. If a match signal 925 is generated (1120), then the match signal may be sent to the game software 950 (1130). After this signal is sent to the game software 950, the game software 950 may cause the specific action to occur in the game (1140). For example, game software 950 may allow the game character to move forward in the game. If a match signal 925 is not generated (1120), then the user may move the next item of jewelry (e.g. ring 850) within the magnetic field of the primary coil (1110).

If all the worn items of jewelry (e.g., rings 850, 860 and item 870) are moved within the magnetic field of the primary coil and there still is no match, at least one of the worn jewelry's capacitance and/or inductance may be modified to modify the resonant frequency of the corresponding LC tank circuit (1150). For e.g., user may modify capacitance if ring 860 includes LC circuit with a variable capacitance, an inductance if ring 860 includes an LC circuit with a variable inductance, or both if ring 860 includes both a variable inductance and a variable capacitance.

If a match signal 925 is generated (1160), then the match signal 925 may be sent to the game software 950 (1130). The game software 950 may then allow the character to move forward in the game (1140). If a match signal 925 is not generated (1160), then the user may modify the next ring's capacitance and/or inductance (1150). For e.g., user may modify capacitance if ring 850 includes LC circuit with a variable capacitance, an inductance if ring 850 includes an LC circuit with a variable inductance, or both if ring 850 includes both a variable inductance and a variable capacitance. The process continues until a match signal 925 is generated.

Figure 12:
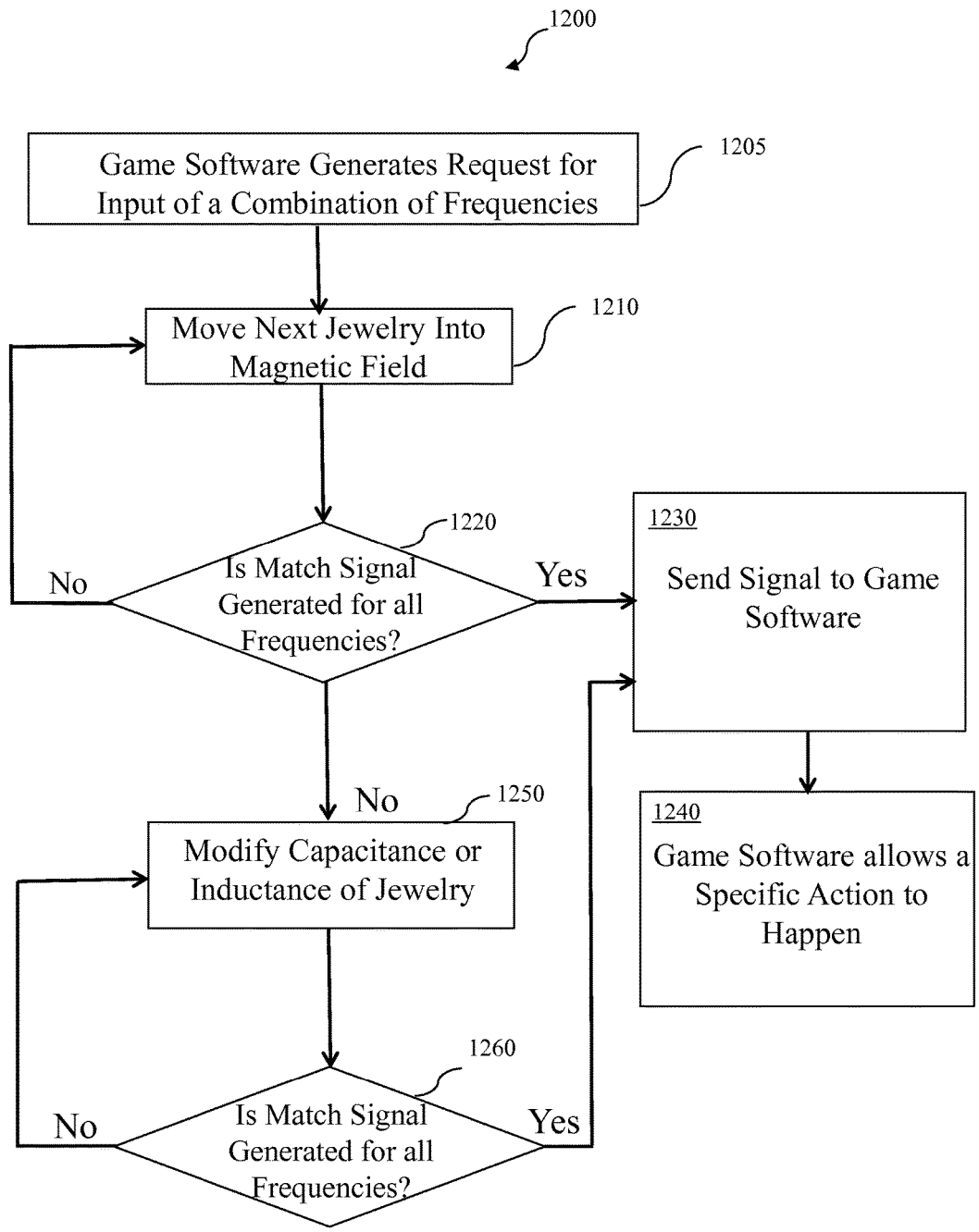
FIG. 12 depicts a flow chart of a receive detection system for detecting input of a particular combination of frequencies in accordance with certain embodiments of the present invention

In certain embodiments, FIG. 12 is a flow chart that depicts an exemplary method 1200 that the user may follow in order to cause a specific action to occur in the game. The game software 950 may generate a request an input of a particular combination of frequencies (1205). For example, game software 950 may request a user to provide an input of a particular combination of frequencies so that a game character moves forward in the game, or performs a particular combination of moves or actions. For example, user may be requested to provide a first frequency f1 from ring 860 and a second frequency f2 from ring 850.

A user may then move each piece of jewelry (e.g., ring 860) containing a LC tank circuit within the magnetic field of the primary coil (1210). A match signal 925 may be generated from the LC Detection Circuit 920 if a sequence or combination of particular desired frequencies may be detected from multiple rings (e.g., rings 850 and 860). If a match signal 925 is generated for each item of jewelry (e.g., ring 860 provides a frequency input equivalent to f1 and ring 850 provides a frequency input f2) (1220), then the match signal may be sent to the game software 950 (1230).

If all the worn items of jewelry (e.g., rings 850 and 860) are moved within the magnetic field of the primary coil and there still is no match (1220), at least one of the worn jewelry's capacitance and/or inductance may be modified to modify the resonant frequency of the corresponding LC tank circuit (1250). For example, user may modify capacitance if ring 860 includes LC circuit with a variable capacitance, an inductance if ring 860 includes an LC circuit with a variable inductance, or both if ring 860 includes both a variable inductance and a variable capacitance.

If a match signal 925 is generated (1260), then the match signal 925 may be sent to the game software 950 (1230). The game software 950 may then perform the specific function, e.g., allow the game character to move forward in the game or perform a combination move (1240). If a match signal 925 is not generated (1260), then the user may modify the next jewelry item's capacitance and/or inductance (1250). For e.g., user may modify capacitance if ring 850 includes LC circuit with a variable capacitance, an inductance if ring 850 includes an LC circuit with a variable inductance, or both if ring 850 includes both a variable inductance and a variable capacitance. The process continues until a match signal 925 is generated.

While the above description contains many specifics and certain exemplary embodiments have been described and shown in the accompanying drawings, it is to be understood that such embodiments are merely illustrative of and not restrictive on the broad invention, and that this invention is not limited to the specific constructions and arrangements shown and described, since various other modifications may occur to those ordinarily skilled in the art, as mentioned above. The invention includes any combination or subcombination of the elements from the different species and/or embodiments disclosed herein.

I claim:

1. A wearable input device for a game, comprising:
   a primary circuit comprising a power source and a primary coil for generating a magnetic field; and
   one or more movable secondary circuits each comprising an LC tank circuit,
   wherein the wearable input device is configured to generate a control signal for the game based on positions of the one or more secondary circuits relative to the magnetic field.

2. The wearable input device of claim 1, wherein the primary circuit and the secondary circuits are integrated within one or more pieces of jewelry.

3. The wearable input device of claim 2, wherein the primary circuit is integrated within a selected one of a watch, a bracelet and a ring.

4. The wearable input device of claim 2, wherein each of the one or more secondary circuits is integrated within a ring.

5. The wearable input device of claim 1, wherein the control signal is based on a change in current in the primary coil.

6. The wearable input device of claim 5, wherein the change in current in the primary coil is caused by moving one or more of the secondary pieces of jewelry into or out of range of the primary coil.

7. The wearable input device of claim 1, wherein the control signal is based on a resonant frequency of one of the LC tank circuits.

8. The wearable input device of claim 1, wherein the control signal is based on one or more strengths of one or more signals generated as a result of the oscillation or non-oscillation of the LC tank circuits of the one or more secondary circuits.

9. The wearable input device of claim 1, wherein the one or more secondary circuits comprises a plurality of secondary circuits and the control signal is based on one or more strengths of one or more signals generated as a result of oscillation or non-oscillation of the LC tank circuits of the plurality of secondary circuits.

10. The wearable input device of claim 1, wherein at least one secondary circuit comprises at least one of a variable inductor and a variable capacitor for varying a resonant frequency of the at least one secondary circuit.

11. A method for providing input to a computer game, comprising:
    providing a first piece of jewelry comprising a power source and a primary coil;
    providing one or more secondary pieces of jewelry each comprising an LC tank circuit;
    generating a current in the primary coil to generate a magnetic field; and
    generating a control signal for the game based on positions of the one or more secondary circuits relative to the magnetic field.

12. The method of claim 11, wherein the first piece of jewelry comprises a selected one of a watch, a bracelet and a ring.

13. The method of claim 11, wherein each of the secondary pieces of jewelry comprises a ring.

14. The method of claim 11, wherein the control signal is based on a detected change in current in the primary coil.

15. The method of claim 14, wherein the detected change in current in the primary coil is caused by moving one or more of the secondary pieces of jewelry into or out of range of the primary coil.

16. The method of claim 11, wherein the control signal is based on a resonant frequency of one of the LC tank circuits.

17. The method of claim 11, wherein the control signal is based on one or more strengths of one or more signals generated as a result of the oscillation or non-oscillation of the LC tank circuits of the one or more secondary pieces of jewelry.

18. The method of claim 11, wherein the one or more secondary pieces of jewelry comprises a plurality of secondary pieces of jewelry and the control signal is based on the relative strength of one or more signals generated as a result of the oscillation or non-oscillation of the LC tank circuits of the plurality of secondary pieces of jewelry.

19. The method of claim 11, wherein the at least one of the secondary pieces of jewelry comprises at least one of a variable inductor and a variable capacitor for varying the first resonant frequency.

* * * * *